US009747889B2

(12) United States Patent
Shirakihara

(10) Patent No.: US 9,747,889 B2
(45) Date of Patent: Aug. 29, 2017

(54) REVERBERANT SOUND ADDING APPARATUS, REVERBERANT SOUND ADDING METHOD, AND REVERBERANT SOUND ADDING PROGRAM

(71) Applicant: Yamaha Corporation, Hamamatsu-shi, Shizuoka (JP)

(72) Inventor: Futoshi Shirakihara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 37 days.

(21) Appl. No.: 14/930,755

(22) Filed: Nov. 3, 2015

(65) Prior Publication Data

US 2016/0125871 A1 May 5, 2016

(30) Foreign Application Priority Data

Nov. 4, 2014 (JP) ................................. 2014-224765

(51) Int. Cl.

| | |
|---|---|
| ***H03G 3/00*** | (2006.01) |
| ***G10K 15/12*** | (2006.01) |
| ***H04S 7/00*** | (2006.01) |
| *H03G 5/00* | (2006.01) |
| *G10K 11/00* | (2006.01) |

(52) U.S. Cl.

CPC .............. *G10K 15/12* (2013.01); *H04S 7/305* (2013.01); *G10K 11/002* (2013.01)

(58) Field of Classification Search

CPC .......... H04S 7/305; H04S 7/307; H04S 7/301; H04S 2420/07; H04S 3/00; H04S 7/00; H04S 7/30; G10L 2021/02085; G10L 21/0208; G10L 21/028; G01H 17/00; G01H 7/00; G10K 15/12; G10K 15/08

USPC ..... 381/63, 119, 303, 61, 98, 17, 18, 56, 66, 381/94.1, 101, 103, 150, 372, 58

See application file for complete search history.

(56) References Cited

U.S. PATENT DOCUMENTS 5,465,469 A * 11/1995 Sakai ....................... G01H 3/00 29/404
5,491,754 A * 2/1996 Jot .......................... H04S 7/305 381/63
6,782,105 B1 8/2004 Sahara et al.
(Continued)

FOREIGN PATENT DOCUMENTS

JP 2000-69598 A 3/2000
JP 2004-212797 A 7/2004

OTHER PUBLICATIONS

European Search Report issued in counterpart European Application No. 15192021.2 dated May 3, 2016 (eight pages).

*Primary Examiner* — Paul S Kim
*Assistant Examiner* — Norman Yu
(74) *Attorney, Agent, or Firm* — Crowell & Moring LLP

(57) ABSTRACT

A reverberant sound adding apparatus includes a noise generator configured to generate a noise, an impulse noise generator configured to generate an impulse noise comprising an impulse sequence with random time intervals, an addition noise generator configured to generate an addition noise by adding the noise to the impulse noise, an impulse response generator configured to generate a modified impulse response by multiplying the addition noise by an amplitude characteristic of an impulse response that indicates acoustic characteristics of a space, and an impulse response convolver configured to convolve an input audio signal with the modified impulse response.

13 Claims, 11 Drawing Sheets

(56) References Cited

U.S. PATENT DOCUMENTS

| | | | | |
|---|---|---|---|---|
| 7,860,256 | B1 * | 12/2010 | Diedrichsen | H04R 5/04 381/63 |
| 9,245,520 | B2 * | 1/2016 | Neugebauer | G10K 15/12 |
| 2004/0139847 | A1 | 7/2004 | Aiba | |
| 2004/0141623 | A1 | 7/2004 | Kushida | |
| 2009/0296962 | A1 | 12/2009 | Shirakihara | |
| 2012/0263311 | A1 | 10/2012 | Neugebauer et al. | |

* cited by examiner

REVERBERANT SOUND ADDING APPARATUS, REVERBERANT SOUND ADDING METHOD, AND REVERBERANT SOUND ADDING PROGRAM

CROSS REFERENCE TO RELATED APPLICATIONS

This application is based on Japanese Patent Application (No. P2014-224765) filed on Nov. 4, 2014, the contents of which are incorporated herein by reference.

BACKGROUND OF THE PRESENT DISCLOSURE

1. Field of the Present Disclosure

The present disclosure relates to a reverberant sound adding apparatus for adding a signal representing a reverberant sound to an input audio signal.

2. Description of the Related Art

Techniques are known that simulate acoustic characteristics of a prescribed space and add signals (reverberant sound signals) representing reverberant sounds of the space to an input audio signal (input signal). In these techniques, output signals that are obtained by adding reverberant sound signals to an input signal are supplied to speakers and sounds with the reverberant sounds are emitted from the speakers.

One physical factor that influences the auditory impression of the reverberant sound is a temporal density (hereinafter referred to as a "sound density") of a sound that constitute the reverberant sound. The auditory impression corresponding to the sound density of the reverberant sound will be referred to as a "density sense" of the reverberant sound. For example, the reverberant sound having a high sound density causes a densely packed impression, and the reverberant sound having a low sound density produces a sparse impression.

The sound density of the reverberant sounds depends on the kind and the details of an input signal, the acoustic characteristics of a space, and other factors. Therefore, the sound density of preferred reverberant sound also depends. For example, whereas reverberant sounds having a relatively high sound density are preferred as reverberant sounds to be added to a sound of a musical instrument, such as drums, that produces short, strong-attack sounds, reverberant sounds having a relatively low sound density are preferred as reverberant sounds to be added to a sound that is generated when classic music is played in a concert hall with long-lasting reverberations. As a result, there is a demand that the sound density of the reverberant sound be controlled to a proper value according to the kind and the details of an input signal, the acoustic characteristics of a space, and other factors.

JP-A-2000-069598 (for example, paragraph 0008) discloses, as one technique for controlling the sound density of reverberant sounds, a technique that increases the density of generation of an audio signal using an allpass filter. Whereas a reverberant sound adding circuit disclosed in JP-A-2000-069598 that includes a comb filter and an allpass filter can generate a reverberant sound while increasing their sound density, it cannot reproduce acoustic characteristics of a prescribed space because it is not of a convolution type using an impulse response (a physical quantity representing a temporal response that represents acoustic characteristics of a prescribed space; hereinafter may be referred to as IR).

SUMMARY OF THE PRESENT DISCLOSURE

The present disclosure has been made in the above circumstances, and an object of the disclosure is therefore to provide a reverberant sound adding apparatus, a reverberant sound adding method, and a reverberant sound adding program capable of controlling the sound density of a reverberant sound while simulating acoustic characteristics of a prescribed space.

The present disclosure provides a reverberant sound adding apparatus, comprising:

a noise generator configured to generate a noise;

an impulse noise generator configured to generate an impulse noise comprising an impulse sequence with random time intervals;

an addition noise generator configured to generate an addition noise by adding the noise to the impulse noise;

an impulse response generator configured to generate a modified impulse response by multiplying the addition noise by an amplitude characteristic of an impulse response that indicates acoustic characteristics of a space; and an impulse response convolver configured to convolve an input audio signal with the modified impulse response.

There is also provided a reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

There is also provided a reverberant sound adding program for causing a computer to execute a reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

In the present disclosure, a modified impulse response is generated from an addition noise generated by adding an impulse sequence having random time intervals to a noise and an audio signal is convolved with the generated modified impulse response. As a result, the convolved signal has random time intervals corresponding to those of the impulse noise and hence varies in sound density. Thus, the reverberant sound adding apparatus according to the present disclosure can control the sound density of the reverberant sound.

DETAILED DESCRIPTION OF THE EXEMPLARY EMBODIMENTS

An embodiment of the present disclosure will be hereinafter described with reference to the drawings.

<Embodiment>

Figure 1:
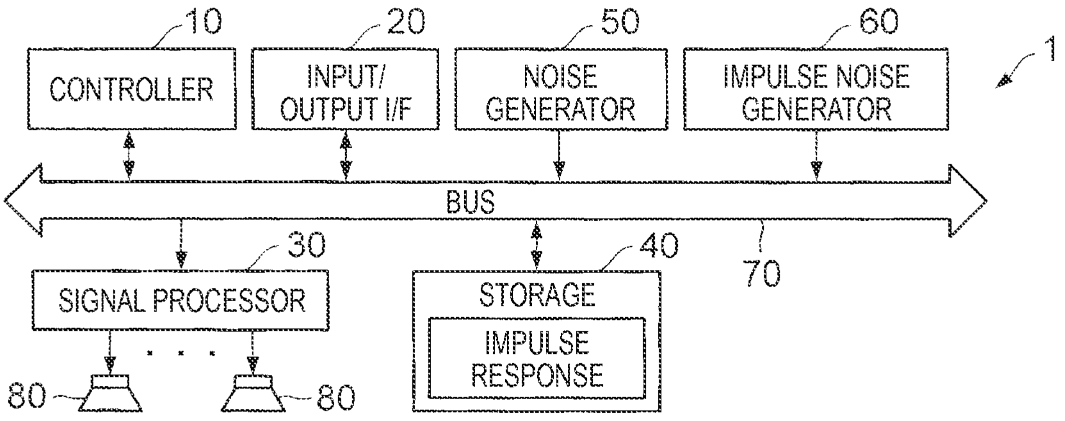
FIG. 1 is a block diagram illustrating the configuration of a reverberant sound adding apparatus 1 according to an embodiment of the present disclosure.

FIG. 1 is a block diagram illustrating the configuration of a reverberant sound adding apparatus 1 according to the embodiment of the present disclosure. The reverberant sound adding apparatus 1 includes a controller 10, an input/output interface (hereinafter abbreviated as "input/output I/F") 20, a signal processor 30, a storage 40, a noise generator 50, an impulse noise generator 60, and a bus 70 for data exchange between the above constituent elements. The reverberant sound adding apparatus 1 has a single input system for receiving an audio signal and plural (in the embodiment, N) output systems for outputting output signals. Speakers 80 are connected to the reverberant sound adding apparatus 1 in the same number as the number of output systems.

The reverberant sound adding apparatus 1 is an apparatus that adds a signal (reverberant sound signal) representing sound density of the reverberant sound to an input audio signal (input signal) and outputs resulting output signals to the speakers 80. The reverberant sound adding apparatus 1 is used in theaters, movie theaters, etc. The plural speakers 80 which are connected to the reverberant sound adding apparatus 1 are installed on, for example, walls of a theater or a movie theater.

The controller 10 is a CPU (central processor), for example. The controller 10 functions as the center of control of the reverberant sound adding apparatus 1 by running programs (not shown) stored in the storage 40. The storage 40 is a storage device including a nonvolatile storage such as a flash ROM and a volatile storage such as a RAM (random access memory). The programs to be run by the controller 10 are stored in the nonvolatile storage. An example of the programs is a program for specifying, for the signal processor 30, various parameters to be used for modifying an input signal.

The nonvolatile storage is also stored with an impulse response (IR). For example, the impulse response is one obtained by a measurement in a prescribed space (e.g., theater or movie theater). Alternatively, the impulse response may be one obtained by simulating (calculating) reflected sound propagation characteristics in a prescribed space. As a further alternative, the impulse response may be one obtained by combining, editing, or modifying, as appropriate, an impulse response(s) obtained by a measurement or a simulation (calculation). In essence, it suffices that the impulse response be one representing acoustic characteristics of a prescribed space. In the embodiment, the nonvolatile storage is stored with an impulse response that has been measured with a typical sound source and sound receiving point in a space. The volatile storage is used as a work area when a program stored in the nonvolatile storage is run.

The input/output I/F 20 includes a manipulation device such as a mouse and a display device. The manipulation device of the input/output I/F 20 sends a signal corresponding to a user manipulation to the controller 10. The display device of the input/output I/F 20 displays information corresponding to a control of the controller 10 on the screen. The user can specify, for example, details of a space through the input/output I/F 20. For example, the user specifies position information of a wall surface by manipulating the manipulation device.

The noise generator 50 is a noise generator for generating prescribed noises, which are stationary noises that, like white noise, are constant in level and has wide-band frequency components. In the embodiment, the noise generator 50 generates, for the respective output systems, plural (N) noises that are different from and independent of each other. More specifically, the noise generator 50 generates plural (N) noises that have no (or a low) correlation with each other. The noises generated by the noise generator 50 are approximately the same in time length as the impulse response (e.g., about 10 s). The generated noises are passed to the signal processor 30.

The impulse noise generator 60 generates an impulse noise which is a sequence of impulses that are generated at random time intervals. In the embodiment, specifically, the random time intervals are determined under a control using prescribed probabilities. That is, the impulse noise is an impulse sequence having time intervals that occur at prescribed probabilities.

Figures 2A, 2B:
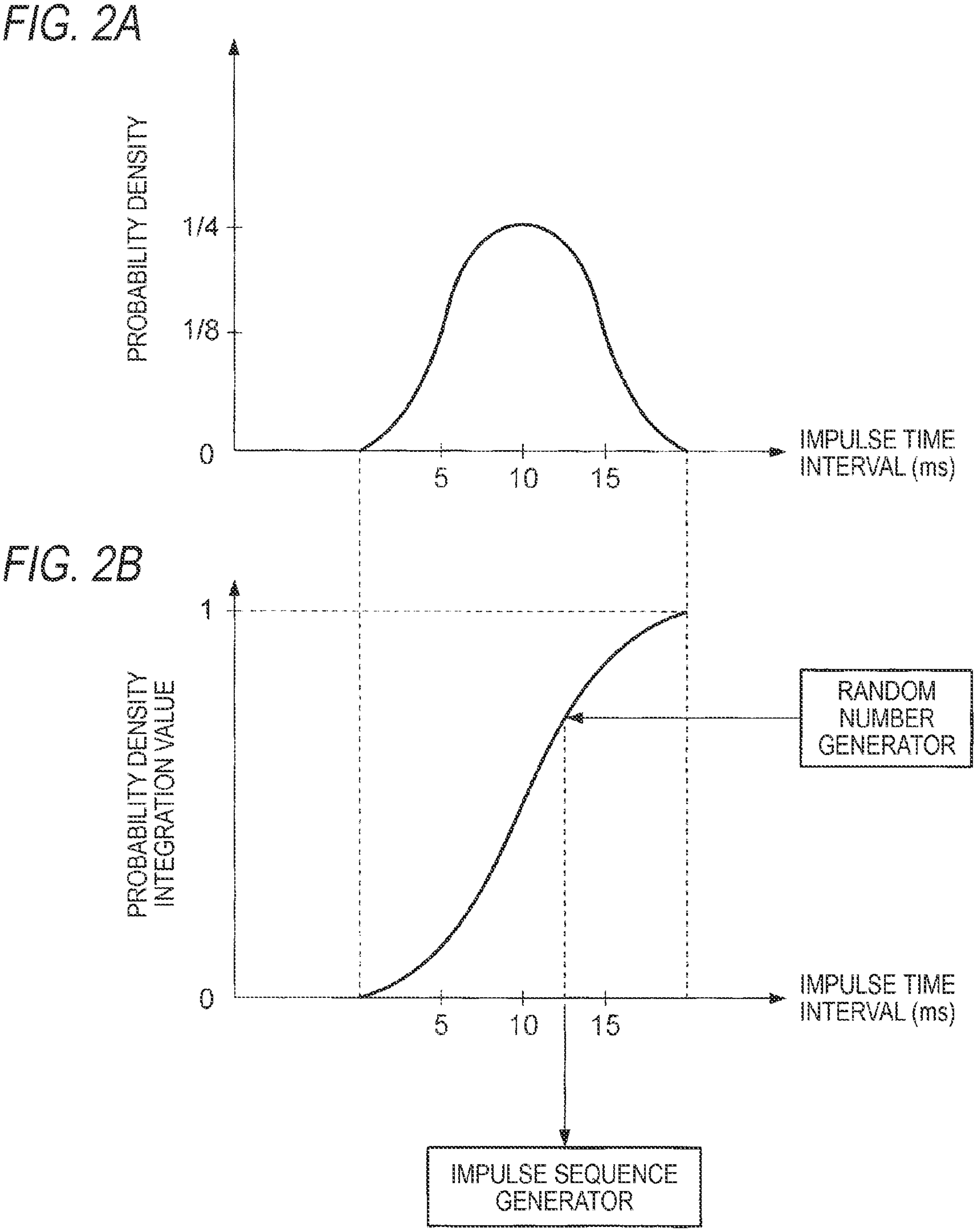
FIGS. 2A and 2B illustrate the concept of impulse noise generation processing of an impulse noise generator 60.

FIGS. 2A and 2B illustrate the concept of impulse noise generation processing of the impulse noise generator 60. FIG. 2A shows a probability density function of time intervals at which individual impulses of an impulse sequence occur. The impulse noise generator 60 generates an impulse sequence by generating individual impulses according to the probability density function illustrated in FIG. 2A. The impulse time interval on the horizontal axis in FIG. 2A is the time to occurrence of the next impulse and the probability density on the vertical axis is the probability that an impulse is generated at that time interval. For example, the probability that the next impulse is generated at a time interval of 5 ms is 1/8, the probability that the next impulse is generated at a time interval of 10 ms is 1/4, and the probability that the next impulse is generated at a time interval of 15 ms is 1/8.

FIG. 2B shows an example method for generating an impulse sequence using the probability density function of FIG. 2A. The curve illustrated in FIG. 2B indicates the function value obtained by integrating the probability density function of FIG. 2A over the time interval range from 0 to the value concerned. In the impulse sequence generating method of FIG. 2B, the impulse noise generator 60 includes a random number generator that generates random numbers (more specifically, pseudo-random numbers) of 0 to 1 sequentially and uniformly according to a clock, for example. The value of the random number generated by the random number generator is correlated with the probability density function integration value illustrated in FIG. 2B. The impulse noise generator 60 determines a time interval value from a probability density function integration value corresponding to a generated random number. And an impulse sequence generator generates an impulse sequence on the basis of time intervals thus determined. In this manner, impulses can be generated sequentially at time intervals that occur at prescribed probabilities according to the preset probability density function.

Whereas the time interval of the generated impulse varies as time elapses, the average time interval between impulses is kept at a prescribed value (i.e., a value determined by the above probability density function) because the generation of impulses is governed by the probability density function. In actuality, for example, processing of generating impulses is performed so that an impulse sequence includes about 1,000 impulses in about 0.1 to 20 s. Therefore, the average time interval between impulses is set at about 0.1 to 20 ms. The generated impulse noise is passed to the signal processor 30.

The signal processor 30 illustrated in FIG. 1 is a DSP (digital signal processor), for example, and performs processing of adding reverberant sound signals to an input signal. The signal processor 30 has plural (in the embodiment, N) output terminals, which are connected to the N respective speakers 80. Power amplifiers for driving the speakers 80 are omitted in FIG. 1.

Figure 3:
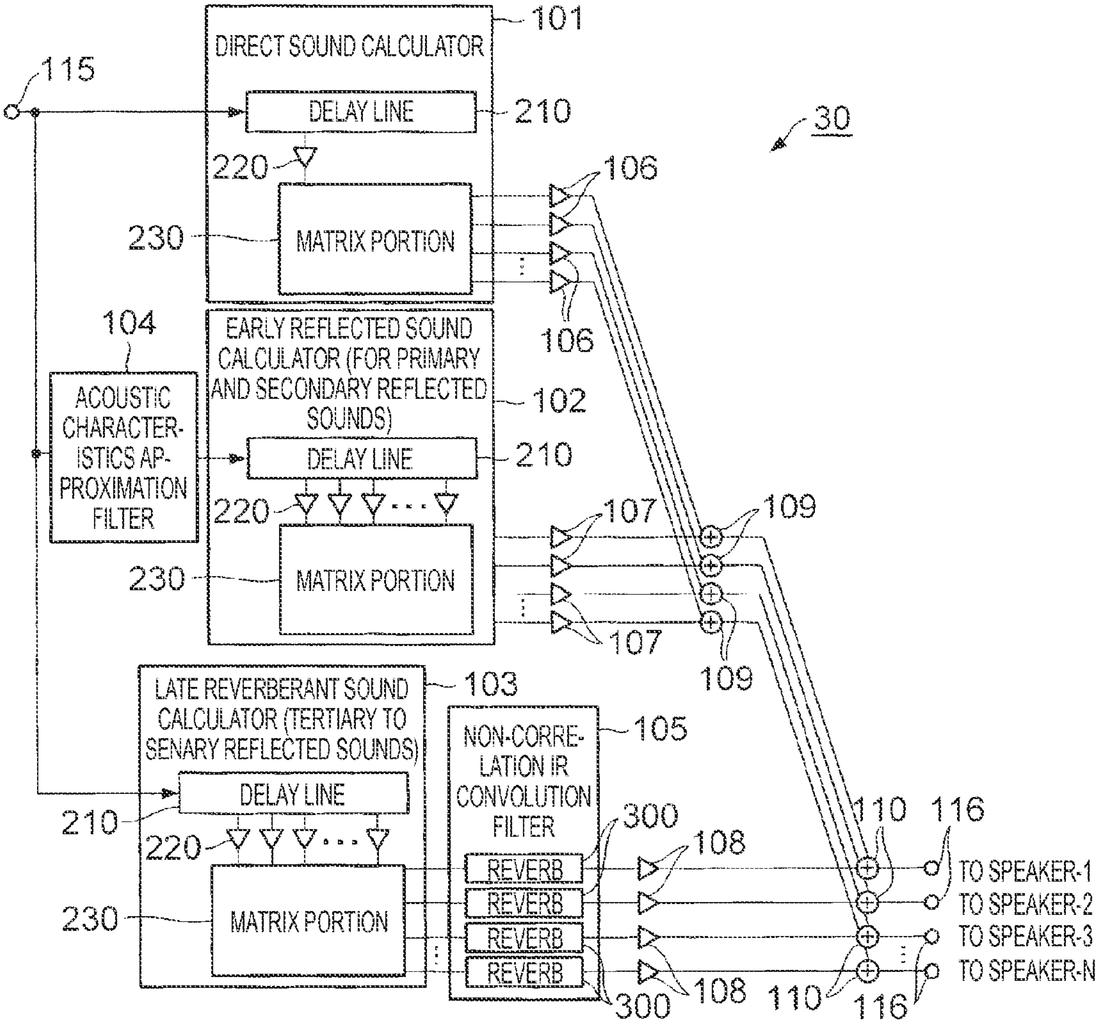
FIG. 3 illustrates the configuration of a signal processor 30 of the reverberant sound adding apparatus 1.

FIG. 3 shows the overall configuration of the signal processor 30. As illustrated in FIG. 3, the signal processor 30 includes a direct sound calculator 101, an early reflected sound calculator 102, a late reverberant sound calculator 103, an acoustic characteristics approximation filter 104, a non-correlation IR convolution filter 105, multipliers 106, 107, and 108, and adders 109 and 110. One input signal is input to the signal processor 30 at input terminal 115, and N different signals are output from it through N output systems.

In general, in a certain space, a sound that originates from sound sources such as musical instruments and reaches a sound receiving point where a listener exists includes a direct sound and a reverberant sound. The reverberant sounds include early reflected sounds and late reverberant sounds. In this specification, the term "direct sound" means a sound that reaches a sound receiving point from a sound source. The term "reverberant sound" means a sound that reaches a sound receiving point after a direct sound through reflection by boundaries (e.g., wall surfaces and a ceiling) of a space. The term "early reflected sounds" means early reflected sounds (in particular, mainly primary and secondary ones) that have been reflected only a small number of times among sounds that reach a sound receiving point through reflection by boundaries of a space. The term "late reverberant sounds" means reflected sounds (in particular, mainly tertiary to senary ones) that have been reflected a larger number of times among sounds that reach a sound receiving point through reflection by wall surfaces etc. of an acoustic space. The term "n-order (n=1, 2, 3, . . . ) reflected sound" means a sound that reaches a sound receiving point after n times of reflection by boundaries of a space. The above-mentioned order numbers such as expressed using the terms "secondary," "tertiary," and "senary" are just examples and may be other ones.

The acoustic characteristics approximation filter 104 illustrated in FIG. 3 adds tone quality of a simulation subject space. More specifically, the acoustic characteristics approximation filter 104 is a filter that exhibits a sound attenuation characteristic that the attenuation depends on the distance of a propagation path of early reflected sounds, a filter that exhibits a sound attenuation characteristic that reflects acoustic characteristics relating to reflection of early reflected sounds of wall surfaces etc. of a space, or a like filter.

The direct sound calculator 101, the early reflected sound calculator 102, and the late reverberant sound calculator 103 calculate propagation characteristics relating to a direct sound, early reflected sounds, and late reverberant sounds, respectively. More specifically, the direct sound calculator 101 applies a simulation result of propagation characteristics corresponding to a direct sound propagation path of a space to an input signal that is received from the input terminal 115, and allocates resulting signals to plural output lines to which the respective multipliers 106 are connected.

The early reflected sound calculator 102 applies simulation results of propagation characteristics corresponding to respective propagation paths of early reflected sounds to an input signal that is received from the input terminal 115 via the acoustic characteristics approximation filter 104, and allocates resulting signals to plural output lines to which the respective multipliers 107 are connected.

The late reverberant sound calculator 103 applies simulation results of propagation characteristics corresponding to respective propagation paths of late reverberant sounds to the input signal that is received from the input terminal 115, and allocates resulting signals to plural output lines to which the non-correlation IR convolution filter 105 is connected.

The numbers of output lines of the direct sound calculator 101, the early reflected sound calculator 102, and the late reverberant sound calculator 103 are identical. The output lines of each of the direct sound calculator 101, the early reflected sound calculator 102, and the late reverberant sound calculator 103 correspond to the respective output systems of the reverberant sound adding apparatus 1.

The direct sound calculator 101, the early reflected sound calculator 102, and the late reverberant sound calculator 103 are the same in basic configuration, and their basic calculators are each referred to as an "acoustics calculator 100." The acoustics calculator 100 performs sound field calculation processing that includes processing of calculating reflected sound propagation characteristics using a calculation technique such as a mirror image method or a sound ray tracing method and three-dimensional panning processing of a VBAP (vector base amplitude panning) method, for example.

Figure 4:
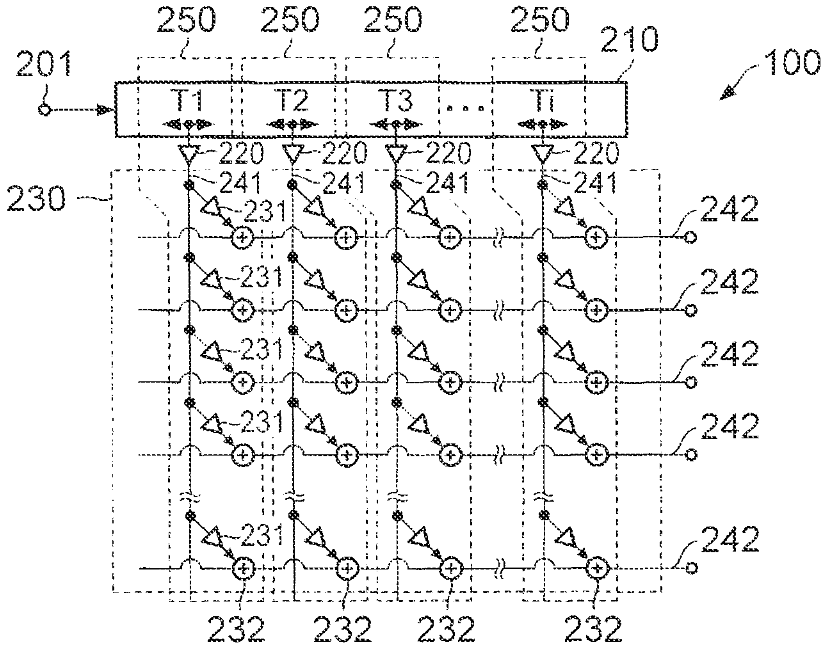
FIG. 4 illustrates the configuration of an acoustics calculator 100 which is a basic calculator of a direct sound calculator 101, an early reflected sound calculator 102, and a late reverberant sound calculator 103 of the signal processor 30.

FIG. 4 shows the configuration of the acoustics calculator 100. The acoustics calculator 100 includes a delay line 210, filters 220, and a matrix portion 230. These individual elements make corrections corresponding to parameters specified by the controller 10 on an audio signal received from an input terminal 201.

The delay line 210 is, for example, a multi-tap delay. The delay line 210 transmits an audio signal received from the input terminal 201 and outputs signals that have been delayed by different times from plural intermediate taps Ti (i=1, 2, 3, . . . ) and correspond to a direct sound or reflected sounds. Therefore, the direct sound calculator 101, the early reflected sound calculator 102, and the late reverberant sound calculator 103 are different from each other in the number of taps Ti. The positions of the plural taps Ti (i=1, 2, 3, . . . ) of the delay line 210 (i.e., delay times of signals that are output from the respective taps) are controlled by the controller 10, and the delay time or times correspond to a delay time of a direct sound or delay times of respective reflected sounds.

The multipliers 220 are disposed downstream of the respective taps Ti (i=1, 2, 3, . . . ). The multipliers 220 multiplies output audio signals of the delay line 210 by particular coefficients specified by the controller 10, respectively, and hence produces signals that reflect characteristics that the sound pressure level of a sound emitted from a sound source attenuates depending on the length of a propagation path it takes. For example, the multiplier 220 performs multiplication processing for producing a signal that reflects an attenuation characteristic of a sound (in this case, direct sound) that reaches a sound receiving point after following a propagation path that is correlated with the tap T1. More specifically, the multiplier 220 multiplies an output audio signal by a relatively small number if the length of a propagation path correlated with it is long and by a relatively large number if the length of a propagation path correlated with it is short.

The matrix portion 230 allocates an output audio signal of each multiplier 220 to plural (in the embodiment, N) output lines 242, and has an input-output number that is equal to the product of "the number of multipliers 220" and "the number (N) of output lines 242)". The number of output lines 242 is equal to the number of output systems of the signal processor 30 (i.e., the number of speakers 80).

The matrix portion 230 will be described below in more detail. The matrix portion 230 has a multiplier 231 and an adder 232 at each position where an input line 214 to which an output signal of a multiplier 220 is supplied crosses an output line 242. The multiplier 231 multiplies a signal received from the input line 241 by a prescribed coefficient specified by the controller 10 and outputs a resulting signal to the adder 232. The processing that the multiplier 231 multiplies a signal by a prescribed coefficient is what is called three-dimensional panning processing. That is, the controller 10 gives the related multipliers 231 proper coefficients corresponding to the respective output systems so that a sound (direct sound or reflected sound) that is input to each input line is localized at a prescribed position. As a result of the processing of the multipliers 231, the direct sound or reflected sound is simulated properly for the propagation direction from a sound source to a sound receiving point. The adders 232 supply output audio signals of the multipliers 231 to the respective output lines 242.

As described above, the acoustics calculator 100 is configured so as to perform processing on an audio signal for each of propagation paths that are assumed in a prescribed space. In the following description, a set of elements that are used for processing an audio signal to simulate one propagation path will be referred to as a "characteristic control system 250." In the example of FIG. 4, each characteristic control system 250 consists of a portion, connected to one input line 201, of the delay line 210 (more specifically, a portion having one tap Ti), one multiplier 220, and N multipliers 231. The description of the configuration of the acoustics calculator 100 completes here. The acoustics calculator 100 is disclosed in JP-A-2004-212797.

Where the characteristic control system 250 is considered one processor, in the embodiment, it can be said that the basic acoustics calculators 100 of the direct sound calculator 101, the early reflected sound calculator 102, and the late reverberant sound calculator 103 are different from each other in the number of characteristic control systems 250. That is, the direct sound calculator 101 has only one characteristic control system 250 (there is only one direct sound propagation path).

The early reflected sound calculator 102 has characteristic control system 250 in the number of all propagation paths of early reflected sounds, that is, in the number that is the sum of the number of all propagation paths of primary reflected sounds and the number of all propagation paths of secondary reflected sounds. For example, in a three-dimensional space that assumes a rectangular parallelepiped, the number of characteristic control system 250 of the early reflected sound calculator 102 is equal to 24 because the number of propagation paths of primary reflected sounds is equal to six and the number of propagation paths of secondary reflected sounds is equal to 18.

The late reverberant sound calculator 103 has characteristic control system 250 in the number of all propagation paths of late reverberant sounds, that is, in the number that is the sum of the number of all propagation paths of tertiary reflected sounds, the number of all propagation paths of quarternary reflected sounds, the number of all propagation paths of quinary reflected sounds, and the number of all propagation paths of senary reflected sounds.

Figure 5:
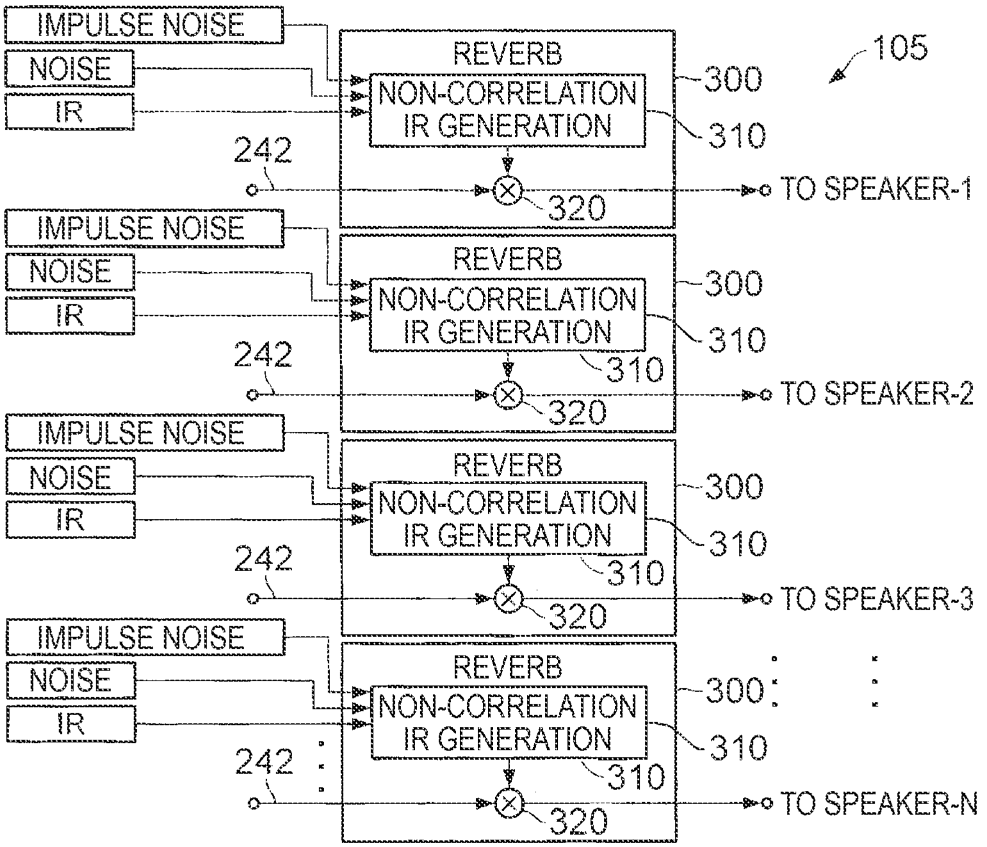
FIG. 5 illustrates the configuration of a non-correlation IR convolution filter 105 of the signal processor 30.

Next, the non-correlation IR convolution filter 105 will be described, which is disposed downstream of the late reverberant sound calculator 103 (more specifically, its matrix portion 230). FIG. 5 shows the configuration of the non-correlation IR convolution filter 105. The non-correlation IR convolution filter 105 has reverbs 300 for the respective output lines 242 of the late reverberant sound calculator 103. Each reverb 300 includes a non-correlation IR generator 310 and a convolution processor 320.

The non-correlation IR generators 310 of the respective reverbs 300 generate non-correlation impulse responses that have no correlation with each other. The non-correlation IR generator 310 of each reverb 300 is supplied with an impulse noise from the impulse noise generator 60, a noise from the noise generator 50, and the impulse response from the storage 40. Non-correlation IR generation processing that is performed by the non-correlation IR generator 310 will be describe later. The convolution processor 320 performs processing of convolving an output audio signal of the late reverberant sound calculator 103 with a non-correlation impulse response generated by the non-correlation IR generator 310. The convolution processor 320 outputs an audio signal generated by the convolution processing, as an audio signal representing late reverberant sounds.

Returning to FIG. 3, the multipliers 106 are disposed downstream of the respective output lines 242 of the direct sound calculator 101. The multipliers 106 multiply audio signals (indicating a direct sound) that are output from the output terminals of the direct sound calculator 101 by particular coefficients specified by the controller 10. The multipliers 107 are disposed downstream of the respective output lines 242 of the early reflected sound calculator 102. The multipliers 107 multiply audio signals (indicating early reflected sounds) that are output from the output terminals of the early reflected sound calculator 102 by particular coefficients specified by the controller 10. The multipliers 108 are disposed downstream of the non-correlation IR convolution filter 105. The multipliers 108 multiply audio signals (indicating late reverberant sounds) that have been subjected to the filter processing of the non-correlation IR convolution filter 105 by particular coefficients specified by the controller 10. The sets of multipliers 106, 107, and 108 have roles of adjusting sound volume balance of a direct sound, early reflected sounds, and late reverberant sounds, respectively, according to the sets of coefficients specified by the controller 10.

The adders 109 add output audio signals of the multipliers 106 on the output lines 242 to output audio signals of the multipliers 107 on the corresponding output lines 242. That is, the adders 109 have a role of adding direct sounds to early reflected sounds on an output-system-by-output-system basis. The adders 110 add output audio signals of the adders 109 on the output lines 242 to output audio signals of the multipliers 108 on the corresponding output lines 242. That is, the adders 110 have a role of adding direct sounds, early reflected sounds, and late reverberant sounds together on an output-system-by-output-system basis. The adders 110 output, to the output stage speakers 80, output signals obtained by adding reverberant sound signals to the input signal.

Figure 6:
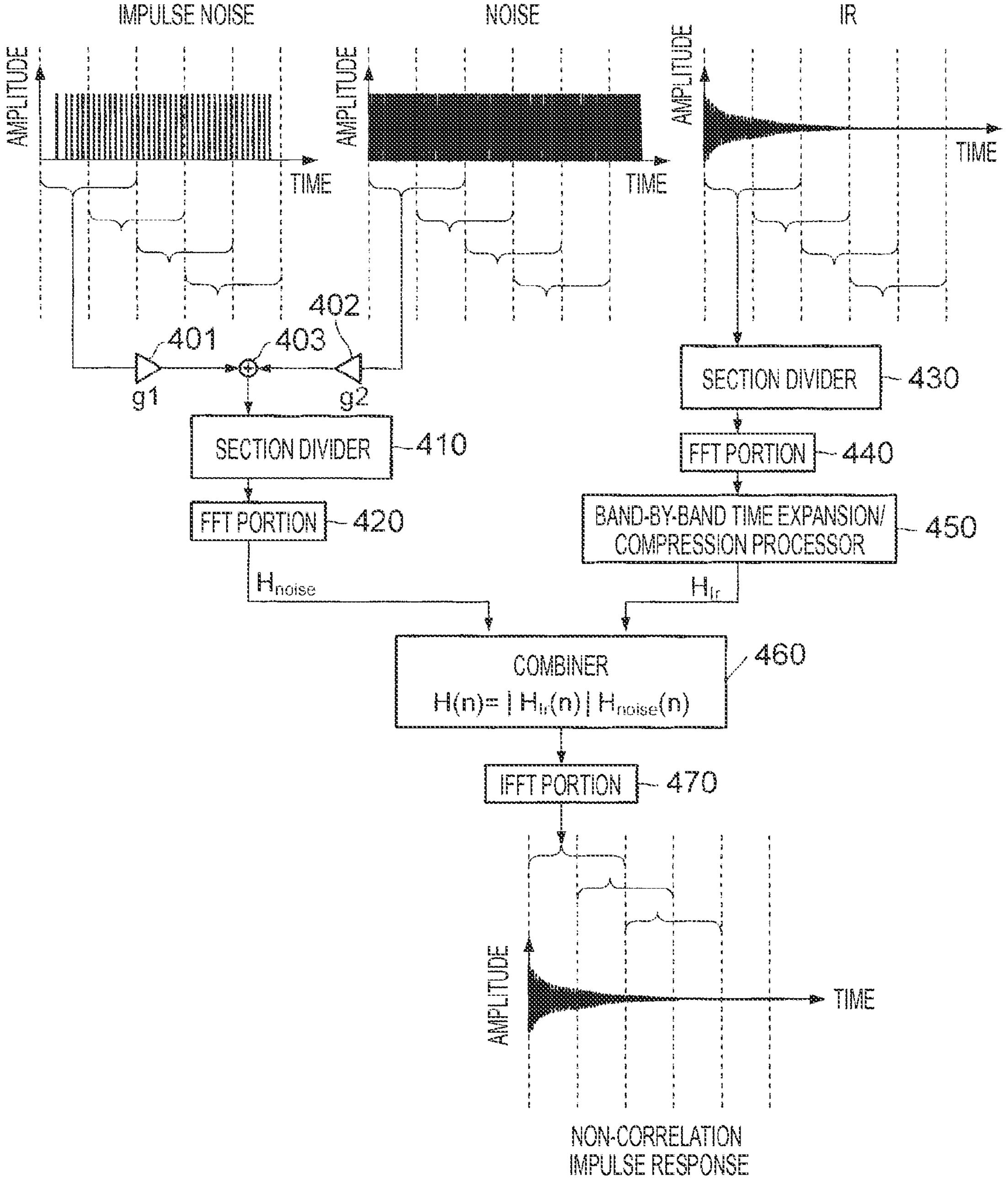
FIG. 6 is a conceptual diagram illustrating the details of processing that is performed by each non-correlation IR generator 310 of the signal processor 30.
Figure 7:
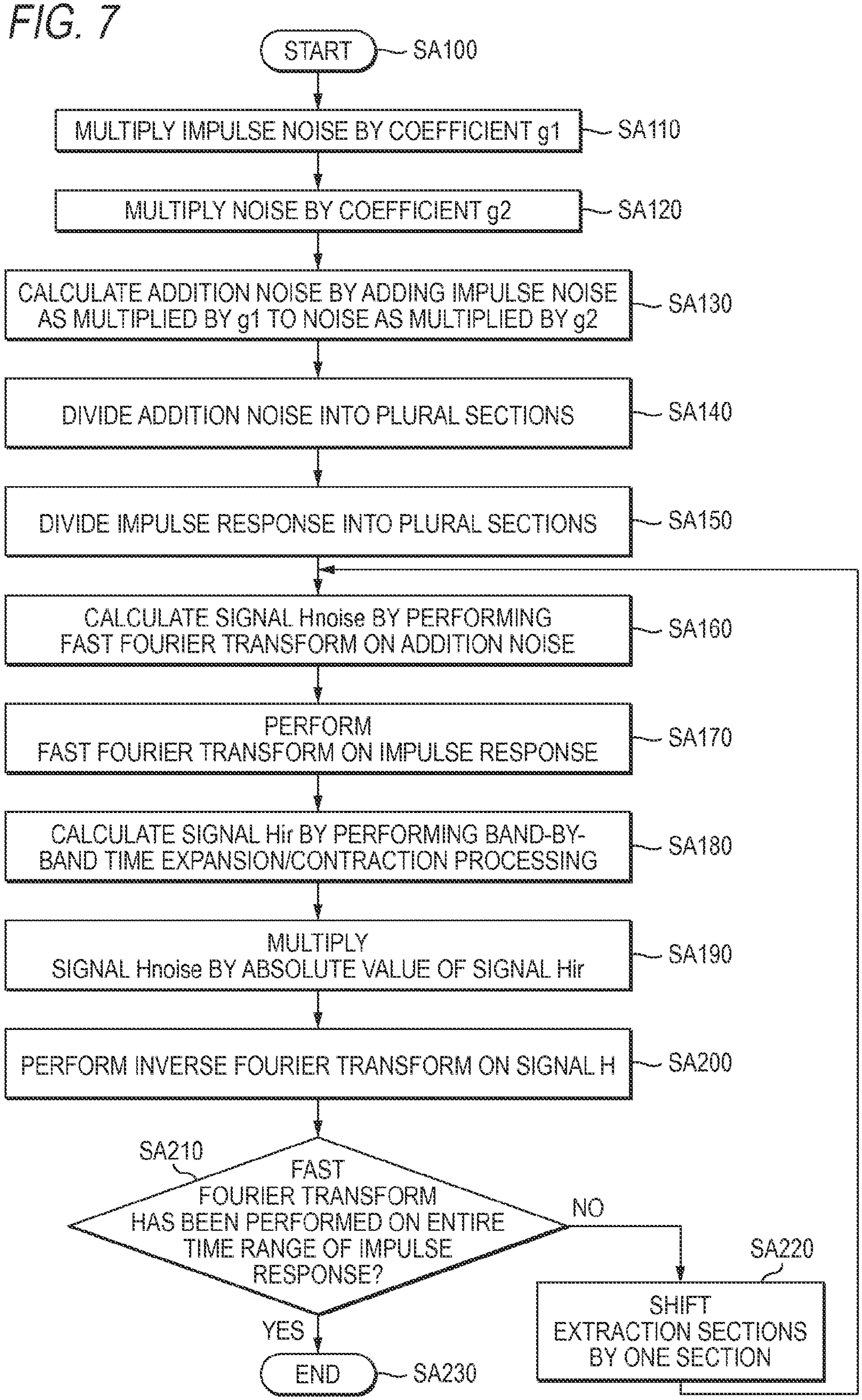
FIG. 7 is a flowchart illustrating the details of the non-correlation IR generation processing performed by each non-correlation IR generator 310.

Next, the non-correlation IR generation processing which is performed by each non-correlation IR generator 310 of the non-correlation IR convolution filter 105 will be described in detail. FIG. 6 is a conceptual diagram illustrating the details of the non-correlation IR generation processing which is performed by each non-correlation IR generator 310. FIG. 7 is a flowchart illustrating the details of the non-correlation IR generation processing.

First, the controller 10 causes the impulse noise generator 60 generated therein to send it to the non-correlation IR generators 310 of the respective reverbs 300. In parallel with this control, the controller 10 causes the noise generator 50 to send plural (in the embodiment, N) noises generated therein and having no correlation with each other to the non-correlation IR generators 310 of the reverbs 300, respectively. In parallel with these controls, the controller 10 reads the impulse response from the storage 40 and sends it to the non-correlation IR generators 310 of the respective reverbs 300. In the following, the processing performed by each non-correlation IR generator 310 of the non-correlation IR convolution filter 105 will be described with reference to FIGS. 6 and 7.

Receiving the impulse noise, at step SA110 illustrated in FIG. 7, the non-correlation IR generator 310 performs multiplication processing of multiplying the impulse noise by a coefficient g1 by means of a multiplier 401 illustrated in FIG. 6. Likewise, receiving the noise, at step SA120 illustrated in FIG. 7, the non-correlation IR generator 310 performs multiplication processing of multiplying the noise by a coefficient g2. At step SA130, the non-correlation IR generator 310 performs addition processing of adding the impulse noise as multiplied by the coefficient g1 to the noise as multiplied by the coefficient g2 by means of an adder 403, whereby an addition noise is generated. That is, the multipliers 401 and 402 which perform the multiplication by the coefficients g1 and g2 and the adder 403 which adds multiplication result signals to each other constitute part of an addition noise generator for generating plural addition noises through addition of impulse noises to respective noises. Including an impulse noise, each generated addition noise has a signal density corresponding to the impulse sequence of the impulse noise. Furthermore, including non-correlation noises, addition noises generated in the respective reverbs 300 are signals having no correlation with each other.

The coefficients g1 and g2 are set at optional values according to instructions from the controllers 10. The magnitudes and the addition proportions of the impulse noise and the noise are determined by the values of the coefficients g1 and g2. For example, if the coefficient g2 is set larger than the coefficient g1, the proportion of the noise is made larger than that of the impulse noise and the sound density of the reverberant sound is increased. In this case, a sound that is high in the density feeling of the reverberant sound is emitted from the associated speaker 80. On the other hand, if the coefficient g1 is set larger than the coefficient g2, the proportion of the impulse noise is made larger than that of the noise and the sound density of the reverberant sound is decreased. In this case, a sound that is low in the density feeling of the reverberant sound is emitted from the associated speaker 80. That is, in the embodiment, the density feeling of the reverberant sound can be changed by the controller 10's controlling the values of the coefficients g1 and g2 independently of each other.

Then, at step SA140, in the non-correlation IR generator 310, a section divider 410 divides the addition noise into plural (in FIG. 6, five) sections in the time axis. Although FIG. 6 is drawn as if each of the noise and the impulse noise were divided into plural sections in the time axis, this is merely to facilitate intuitive understanding. Actually, sectioning is made after the noise and the impulse noise are added to each other by the adder 403.

At step SA150, in the non-correlation IR generator 310, a section divider 430 divides the impulse response into plural sections in the same manner as the sectioning by the section divider 410. More specifically, the section divider 430 divides the impulse response into plural sections in the time axis. The IR division number is the same as the addition noise division number.

At step SA160, in the non-correlation IR generator 310, a fast Fourier transform (FFT) portion 420 performs window function processing and fast Fourier transform. This will be described below more specifically. The non-correlation IR generator 310 extracts an addition noise in two consecutive sections produced by the section divider 410. (The non-correlation IR generator 310 extracts addition noises in respective sets of two consecutive sections taken in order in an overlapped manner from the head of the addition noise in the time axis.) The non-correlation IR generator 310 multiplies the extracted addition noise by a window function, which is a Hanning window function, for example. The non-correlation IR generator 310 performs fast Fourier transform on a window-function-multiplied addition noise. As a result, signals Hnoise which are signals obtained by frequency-converting extracted addition noises in respective sets of two consecutive sections are generated sequentially.

Then, at step SA170, in the non-correlation IR generator 310, a fast Fourier transform (FFT) portion 440 performs window function processing and fast Fourier transform in the same manner as the FFT portion 420 does. More specifically, the non-correlation IR generator 310 extracts an impulse response in two consecutive sections produced by the section divider 430. (The non-correlation IR generator 310 extracts impulse responses in respective sets of two consecutive sections taken in order in an overlapped manner from the head of the impulse response in the time axis.) The non-correlation IR generator 310 multiplies the extracted impulse response by a window function, which is a Hanning window function, for example. The non-correlation IR generator 310 performs fast Fourier transform on a window-function-multiplied impulse response. As a result, signals obtained by frequency-converting the extracted impulse responses in respective sets of two consecutive sections are generated sequentially.

Then, at step S180, in the non-correlation IR generator 310, a band-by-band time expansion/compression processor 450 performs band-by-band time expansion/compression processing on a signal produced by the fast Fourier transform by the FFT portion 440. The band-by-band time expansion/compression processing is processing of performing time expansion/compression processing in each frequency band. The time expansion/compression processing is processing of expanding (or compressing) the reverberation time of the late reverberant sound.

Figure 8A:
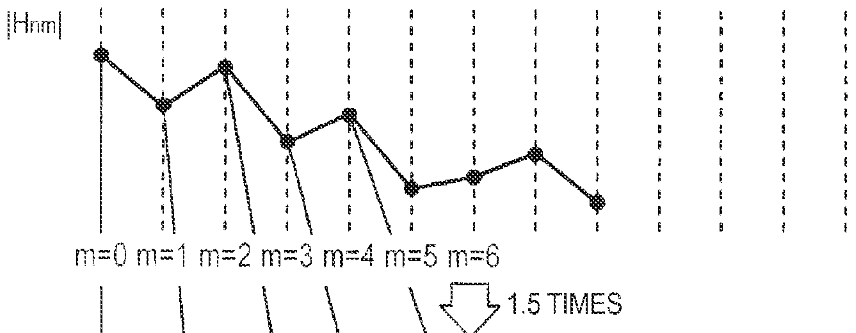
FIGS. 8A and 8B illustrate example time expansion/compression processing that is performed by a band-by-band time expansion/compression processor 450 of the non-correlation IR generator 310.
Figure 8B:
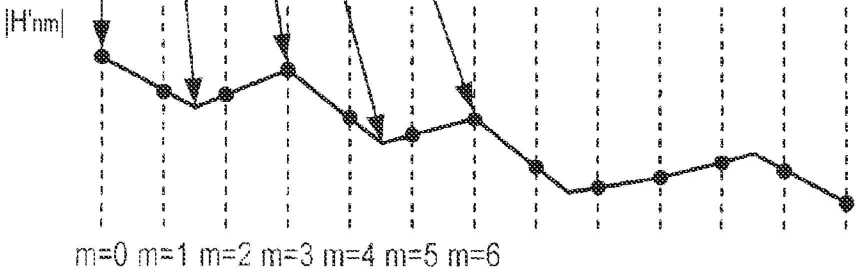

FIGS. 8A and 8B show example time expansion processing which is performed by the band-by-band time expansion/compression processor 450. FIG. 8A shows a signal before being subjected to the time expansion processing. FIG. 8B shows a signal after being subjected to the time expansion processing and is a signal obtained by expanding the signal illustrated in FIG. 8A by a factor of 1.5 in the time axis direction. In FIGS. 8A and 8B, the horizontal axis represents time and the vertical axis represents the amplitude. For example, as a result of the 1.5-fold time expansion, an amplitude that is located at a third time position (m=3) from a leftmost reference position (m=0) in the time-expanded signal illustrated in FIG. 8B corresponds to an amplitude that is located at a second time position (m=2) from the reference position (m=0) in the original signal illustrated in FIG. 8A. An amplitude that is located at a sixth time position (m=6) from the reference position (m=0) in the time-expanded signal illustrated in FIG. 8B corresponds to an amplitude that is located at a fourth time position (m=4) from the reference position (m=0) in the original signal illustrated in FIG. 8A.

This expansion/compression in the time axis is realized by simple linear interpolation, polynomial interpolation, or the like. The time expansion/compression processing performed by the band-by-band time expansion/compression processor 450 is thus processing of expanding or compressing the manner of temporal transition of the amplitude, in each frequency bin, of a signal obtained by the fast Fourier transform.

Figure 9:
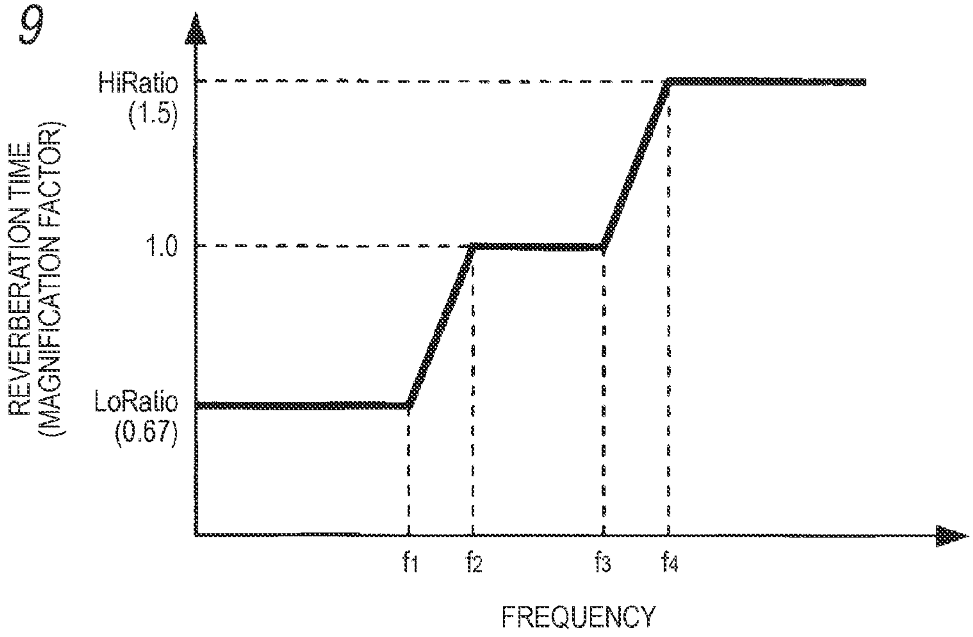
FIG. 9 illustrates example band-by-band time expansion/compression processing that is performed by the band-by-band time expansion/compression processor 450 of the non-correlation IR generator 310.

FIG. 9 shows example band-by-band time expansion/compression processing. In FIG. 9, the horizontal axis represents frequency and the vertical axis represents the magnification factor of time expansion for the reverberation time. In the example of FIG. 9, the magnification factor of time expansion is equal to 1 in a band from frequency $f_2$ to $f_3$. That is, in the band from frequency $f_2$ to $f_3$, the reverberation time is not changed by the time expansion processing. On the other hand, the magnification factor of time expansion is smaller than 1 in a frequency range that is lower than frequency $f_2$ (in particular, a frequency range that is lower than frequency $f_1$). And the magnification factor of time expansion is larger than 1 in a frequency range that is higher than frequency $f_3$ (in particular, a frequency range that is higher than frequency $f_4$).

That is, in the frequency range that is lower than frequency $f_2$, the reverberation time is shortened because of time compression by the time expansion/compression processing. In the frequency range that is higher than frequency $f_3$, the reverberation time is elongated because of time expansion by the time expansion/compression processing. Thus, the band-by-band time expansion/compression processing can change the reverberation time for each band, for example, in such a manner as to change the reverberation time in high and low frequency ranges (low damping and high damping) while not changing it in a medium frequency range.

Subsequently, as illustrated in FIG. 6, in the non-correlation IR generator 310, at step SA190 a combiner 460 performs combining processing of multiplying the signals Hnoise obtained by the FFT portion 420 by the absolute values of the signals Hir obtained by the band-by-band time expansion/compression processor 450 and outputs combined signals H. The combiner 460 performs combining processing by multiplication every time the section dividers 410 and 430 output a set of two divisional addition noises and a set of two divisional impulse responses, respectively. Thus, the combining processing can cause the amplitude (what is called a frequency characteristic) of an IR frequency response to reflect an addition noise time response characteristic.

Since the addition noise has been generated by addition of the wide-band stationary noise and the impulse noise that is an impulse sequence, reverberation sounds obtained by incorporating, by convolution, the signal H obtained by the combining processing reflect a sound density corresponding to the addition noise. Furthermore, since the phase characteristic of the addition noise is conserved in the signal H obtained by the combining processing, signals H generated by the respective reverbs 300 are also signals having no correlation with each other.

Then, at step SA200, in the non-correlation IR generator 310, an inverse Fourier transform (IFFT) portion 470 performs inverse Fourier transform (IFFT) sequentially on the signals H obtained by the combiner 460. Then, at step SA210, the non-correlation IR generator 310 judges whether or not the fast Fourier transform has been performed in the entire time range of the impulse response. If the judgment result of step SA210 is negative, at step SA220 the non-correlation IR generator 310 shifts the two consecutive extraction sections forward by one section. Then the process returns to step SA160 and the non-correlation IR generator 310 executes steps SA160-SA210 again.

In executing steps SA160-SA210 again, at step SA160 the non-correlation IR generator 310 extracts an addition noise in the two sections that are shifted forward by one section and subjecting it to window function processing and fast Fourier transform. At step SA170, the non-correlation IR generator 310 extracts an impulse response in the two sections that are shifted forward by one section and subjecting it to window function processing and fast Fourier transform. In this manner, the non-correlation IR generator 310 performs short-time Fourier transform over the entire range of the impulse response and the addition noise in such a manner that in each repetition steps SA160-SA210 are executed in two sections that are shifted by one section.

If the judgment result of step SA210 is affirmative, the non-correlation IR generator 310 combines together plural inverse Fourier transform results obtained by executing steps SA160-SA210 repeatedly. The process is finished at step S230.

In the above-described manner, the non-correlation IR generators 310 generate non-correlation impulse responses having no correlation with each other for the respective output lines 242 of the late reverberant sound calculator 103. Considering the details of the processing performed by each non-correlation IR generator 310, it can be said that the non-correlation impulse response is an impulse response generated by modifying an impulse response indicating acoustic characteristics of a space using an addition noise and that the combiner 460 of the non-correlation IR generator 310 generates a modified impulse response by multiplying an addition noise by an amplitude characteristic of an impulse response indicating acoustic characteristics of a space.

As described above, the reverberant sound adding apparatus 1 according to the embodiment includes an element (specifically, direct sound calculator 101) for generating an audio signal representing a direct sound, the element (specifically, early reflected sound calculator 102 and acoustic characteristics approximation filter 104) for generating audio signals representing early reflected sounds, and the element (specifically, reverberant sound calculator 103 and non-correlation IR convolution filter 105) for generating audio signals representing reverberant sounds, which are provided separately from each other.

The element for generating an audio signal representing a direct sound does not perform filter processing as performed by the acoustic characteristics approximation filter 104, as a result of which a direct sound is obtained that is low in sound quality degradation. The element for generating audio signals representing early reflected sounds performs filter processing using the acoustic characteristics approximation filter 104 in addition to delaying and three-dimensional panning, as a result of which early reflected sounds are obtained in which a sense of direction is secured and tone quality of a space is reproduced.

The element for generating audio signals representing a late reverberant sound performs filter processing of incorporating a non-correlation impulse response by convolution in addition to delaying and three-dimensional panning, as a result of which audio signals representing late reverberant sounds on the output lines connected to the respective speakers have no correlation with each other. The non-correlation impulse response is a modified impulse response obtained by causing the amplitude (what is called a frequency characteristic) of an IR frequency response to reflect an addition noise time response characteristic. Since an addition noise is generated by adding an impulse noise that is an impulse sequence having time intervals that occur prescribed probabilities, each audio signal representing a late reverberant sound has a sound density corresponding to a sound density of the addition noise. Therefore, in the reverberant sound adding apparatus 1, the sound density of each audio signal representing the late reverberant sound can be controlled by controlling the sound density of an addition noise by changing the addition proportions for it.

With the above-described features, the reverberant sound adding apparatus 1 can generate reverberant sounds in which a sense of direction and IR tone quality are secured and that have a sense of expanse and a proper density sense of the reverberant sound. As such, the reverberant sound adding apparatus 1 can control the sound density of the reverberant sound while simulating, that is, reproducing, acoustic characteristics of a prescribed space. Furthermore, since non-correlation impulse responses are generated from a single impulse response, the reverberant sound adding apparatus 1 can generate the reverberant sound that reflects the acoustic characteristics of a prescribed space.

<Modifications>

Figure 10:
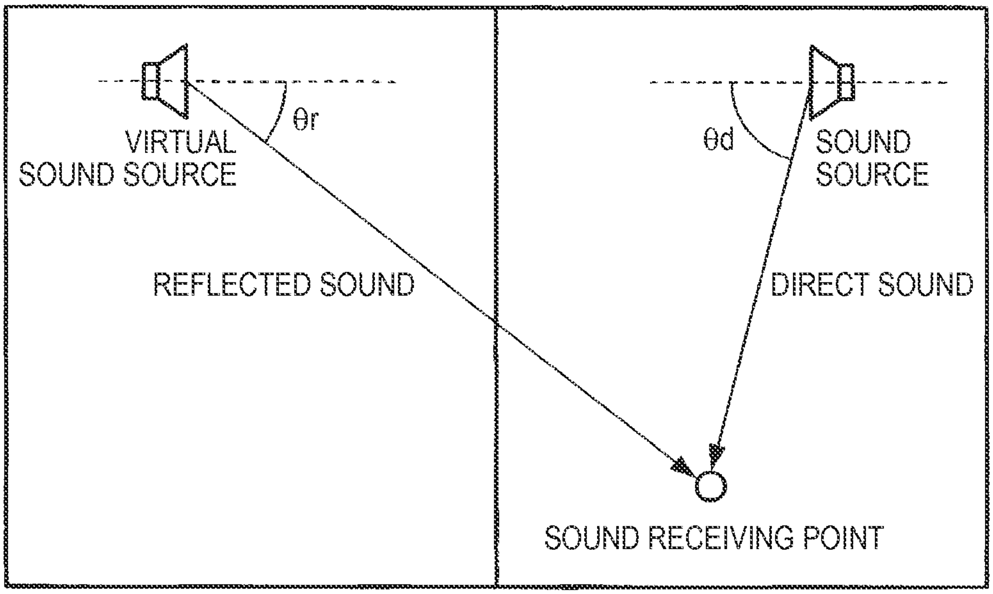
FIG. 10 illustrates modification (1) of the embodiment

Although the one embodiment of the present disclosure has been described, the present disclosure is not limited to the above embodiment and various modifications are possible, examples of which are as follows:

(1) The reverberant sound adding apparatus is not limited to a type in which the reverberant sound generated by simulating acoustic characteristics of a space are added to a received sound that is emitted from a non-directional sound source, and may be of a type in which the reverberant sounds generated by simulating acoustic characteristics of a space are added to a received sound that is emitted from a directional sound source. FIG. 10 shows an example of the latter type. Attenuation parameters, for example, for respective propagation paths are multiplied by weight coefficients according to an angle θd that is formed by the front-side axis of a sound source and the line connecting the sound source and a sound receiving point and an angle θr that is formed by the front-side axis of a virtual sound source of a mirror image method and the line connecting the virtual sound source and the sound receiving point. According to this type of reverberant sound adding apparatus, the reverberant sound can be added taking the directivity of a sound source (e.g., musical instrument) into consideration.

(2) The reverberant sound adding apparatus is not limited to a type in which the reverberant sounds generated by simulating acoustic characteristics of a space are added to a received sound that is emitted from a position-fixed sound source, and may be of a type in which reverberant sounds generated by simulating acoustic characteristics of a space are added to a received sound that is emitted from a moving sound source. This type of reverberant sound adding apparatus can be realized in such a manner that the controller 10 acquires pieces of information indicating positions of the sound source and the sound receiving point successively and determines parameters of the respective elements of the acoustics calculators successively. This type of reverberant sound adding apparatus can add the reverberant sound even if the position of the sound source varies in real time.

Figure 11:
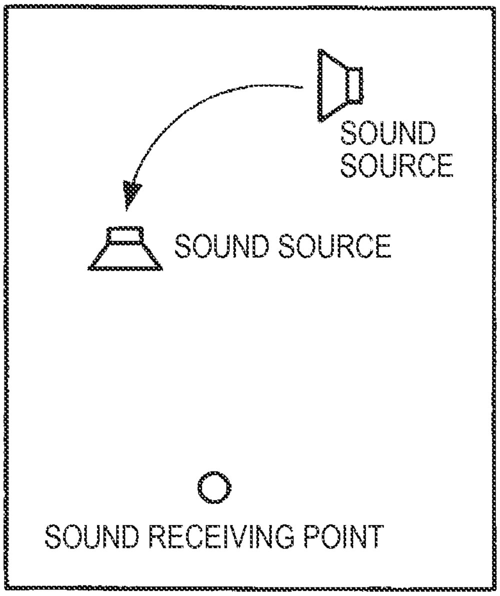
FIG. 11 illustrates modification (3) of the embodiment

(3) The reverberant sound adding apparatus may be of a type in which reverberant sounds generated by simulating acoustic characteristics of a space are added to a received sound that is emitted from a moving sound source while varying in directivity. For example, FIG. 11 shows an example that a sound source having directivity goes forward and turns left by 90°. This type of reverberant sound adding apparatus can be realized by combining the above-described two modes, that is, the mode that the sound source moves and the mode that the sound source has directivity. In this type of reverberant sound adding apparatus, reverberant sounds of a space can be added to a voice of a human who is turning left by 90° while walking.

(4) The reverberant sound adding apparatus is not limited to a type in which the reverberant sounds generated by simulating acoustic characteristics of a space are added to a sound that reaches a sound receiving point whose position is fixed, and may be of a type in which the reverberant sounds generated by simulating acoustic characteristics of a space are added to a sound that reaches a sound receiving point that is moving. This type of reverberant sound adding apparatus can be realized in the same manner as the above-described reverberant sound adding apparatus in which the sound source is moving. According to this type of reverberant sound adding apparatus, the reverberant sound can be added even if the position of the sound receiving point varies in real time. Naturally, another type of reverberant sound adding apparatus is possible in which a simulation is made for a case that both of the sound source and the sound receiving point are moving. In the mode in which the sound receiving point is moving, the sound source may be either non-directional or directional.

Figure 12:
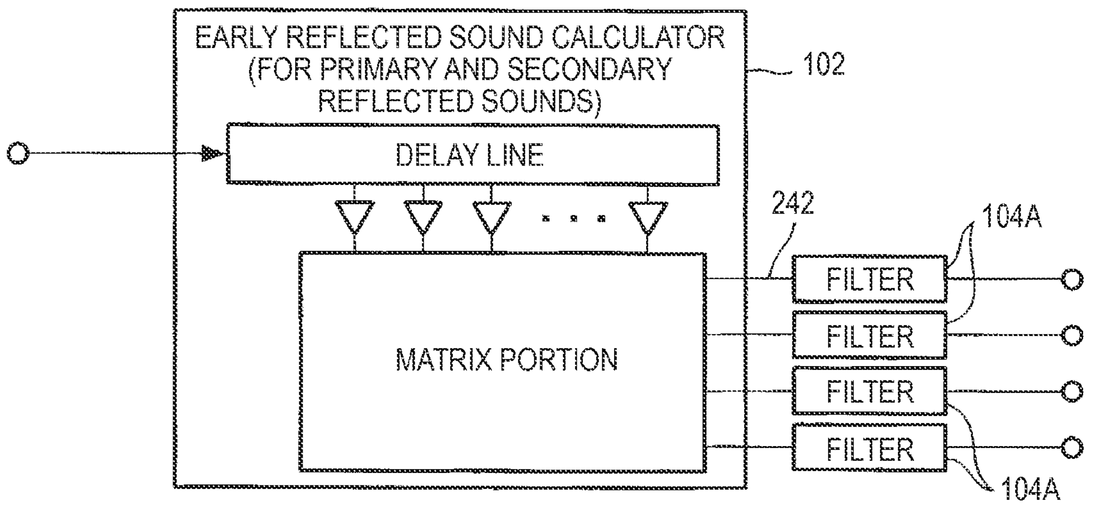
FIG. 12 illustrates modification (5) of the embodiment

(5) In the reverberant sound adding apparatus 1 according to the embodiment, the acoustic characteristics approximation filter 104 is disposed upstream of the early reflected sound calculator 102. However, as illustrated in FIG. 12, acoustic characteristics approximation filters 104A may be disposed downstream of the early reflected sound calculator 102. In this type of reverberant sound adding apparatus, the acoustic characteristics approximation filters 104A are provided for the respective output lines 242. This measure allows the controller 10 to specify different sets of parameters for the respective acoustic characteristics approximation filters 104A provided for the respective output lines 242. Thus, this type of reverberant sound adding apparatus can generate early reflected sounds in which tone quality of a space is reproduced in a more detailed manner.

Figure 13:
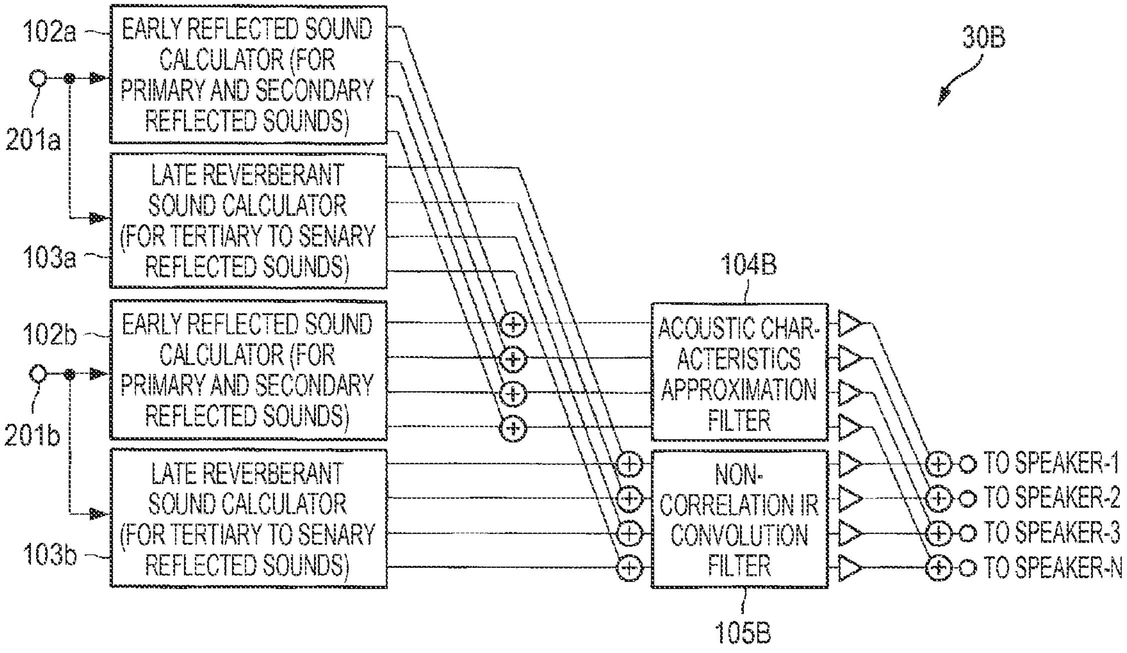
FIG. 13 illustrates the configuration of a signal processor 30B according to modification (6) of the embodiment.

(6) In the embodiment, the signal processor 30 has only one input terminal for receiving an input signal. However, the signal processor may have plural input terminals for receiving different input signals. FIG. 13 shows the configuration of an example signal processor 30B which has two input terminals 201*a* and 201*b*. The signal processor 30B illustrated in FIG. 13 includes an early reflected sound calculator 102*a* which is connected to the input terminal 201*a* and a late reverberant sound calculator 103*a* and also includes an early reflected sound calculator 102*b* which is connected to the input terminal 201*b* and a late reverberant sound calculator 103*b*.

In the signal processor 30B, the early reflected sound calculator 102*a* simulates primary and secondary reflected sounds (early reflected sounds) for a first input signal supplied from the input terminal 201*a* and the early reflected sound calculator 102*b* simulates primary and secondary reflected sounds (early reflected sounds) for a second input signal supplied from the input terminal 201*b*. In the signal processor 30B, audio signals that are output from the early reflected sound calculator 102*a* and audio signals that are output from the early reflected sound calculator 102*b* are added together, and resulting signals are subjected to filter processing of an acoustic characteristics approximation filter 104B.

In parallel with the above processing, in the signal processor 30B, the late reverberant sound calculator 103*a* simulates tertiary to senary reflected sounds (late reverberant sounds) for the first input signal supplied from the input terminal 201*a* and the late reverberant sound calculator 103*b* simulates tertiary to senary reflected sounds (late reverberant sounds) for the second input signal supplied from the input terminal 201*b*. In the signal processor 30B, audio signals that are output from the late reverberant sound calculator 103*a* and audio signals that are output from the late reverberant sound calculator 103*b* are added together, and resulting signals are subjected to filter processing of a non-correlation IR convolution filter 105B. This configuration makes it possible to add the reverberant sound to each of a first input signal and a second input signal.

(7) The reverberant sound adding apparatus 1 according to the embodiment has the plural output systems. However, the reverberant sound adding apparatus may be equipped with only one output terminal. In this type of reverberant sound adding apparatus, the noise generator generates only one noise and the non-correlation IR generator 310 generates only one modified impulse response. Even this type of reverberant sound adding apparatus can control the sound density of the reverberant sound like the reverberant sound adding apparatus 1 according to the embodiment does because the former is the same as the latter in that a modified impulse response is generated from an addition noise and an impulse response.

(8) In the reverberant sound adding apparatus 1 according to the embodiment, the sound density of each addition noise is changed by adjusting the addition proportions of an impulse noise and a noise. However, another type of reverberant sound adding apparatus is possible in which the sound density of each addition noise is changed by changing the time intervals of an impulse sequence in the impulse noise generator 60 by, for example, changing the probability density function according to an instruction from the controller 10. For example, this type of reverberant sound adding apparatus can be applied to a case of movement from one space to another (e.g., from inside a tunnel to outside).

Still another type of reverberant sound adding apparatus is possible in which the manner of variation of the time intervals of an impulse sequence is varied from one sound source to another. A further type of reverberant sound adding apparatus is possible in which the addition proportions of an impulse noise and a noise are varied from one sound source to another. These types of reverberant sound adding apparatus can add the reverberant sounds that are suitable for the kind of a sound source.

(9) In the reverberant sound adding apparatus 1 according to the embodiment, the sound density of each addition noise is changed by the controller 10. However, another type of reverberant sound adding apparatus is possible in which the impulse noise generator 60 and/or the signal processor 30 includes a manipulator, such as a knob, for adjusting the sound densities of addition noises and the sound densities of addition noise are changed according to a manipulation of the manipulator. In this case, either the addition proportions of an impulse noise and a noise or the time intervals of an impulse sequence or both of them may be changed.

(10) In the non-correlation IR generator 310 employed in the embodiment, plural non-correlation impulse responses are generated by combining amplitude characteristics and phase characteristics of plural addition noises and an amplitude characteristic of an impulse response, respectively. However, a non-correlation IR generator is possible in which plural non-correlation impulse responses are generated by combining at least phase characteristics of plural addition noises and an amplitude characteristic of an impulse response, respectively. This is because generated plural impulse responses come to have no correlation with each other by using at least phase characteristics of addition noises.

(11) In the embodiment, the non-correlation IR generator 310 includes the band-by-band time expansion/compression processor 450, the band-by-band time expansion/compression processor 450 may be omitted.

(12) In the embodiment, the noises (stationary noises) generated by the noise generator 50 may be noises other than white noises, such as Gaussian noises or pink noises.

(13) In the reverberant sound adding apparatus 1 according to the embodiment, audio signals representing late reverberant sounds are generated by simulating tertiary to senary reflected sounds. However, the present disclosure is not limited to this mode; for example, audio signals representing late reverberant sounds may be generated by simulating tertiary to quinary reflected sounds or tertiary to septenary reflected sounds. The order numbers of reflected sounds to be used for generating audio signals representing late reverberant sounds may be determined taking into consideration acoustic characteristics of a prescribed space to be simulated and control target sound densities of the late reverberant sounds.

(14) In the reverberant sound adding apparatus 1 according to the embodiment, the addition noise generator, the impulse response generator, and the impulse response convolver are implemented by electronic circuits (specifically, implemented as the signal processor 30). However, for example, a computer may be caused to function as the addition noise generator, the impulse response generator, and the impulse response convolver by letting the controller 10 run a reverberant sound adding program. It is also possible to cause a computer to function as the noise generator and the impulse noise generator by letting the controller 10 run a reverberant sound adding program.

In these cases, the reverberant sound adding program may either be traded in a state that it is installed in a reverberant sound adding apparatus or be traded separately in a state that it is stored in a computer-readable medium. The reverberant sound adding program may also be traded by downloading it over a network.

Here, the details of the above embodiments are summarized as follows.

(1) There is provided a reverberant sound adding apparatus, comprising:

a noise generator configured to generate a noise;

an impulse noise generator configured to generate an impulse noise comprising an impulse sequence with random time intervals;

an addition noise generator configured to generate an addition noise by adding the noise to the impulse noise;

an impulse response generator configured to generate a modified impulse response by multiplying the addition noise by an amplitude characteristic of an impulse response that indicates acoustic characteristics of a space; and an impulse response convolver configured to convolve an input audio signal with the modified impulse response.

(2) For example, the addition noise generator comprises:

a first multiplier configured to multiply the impulse noise by a first coefficient;

a second multiplier configured to multiply the noise by a second coefficient; and an adder configured to generate the addition noise by adding an output of the first multiplier to an output of the second multiplier.

(3) For example, the impulse response generator is configured to generate impulses at time intervals that are determined according to a prescribed probability density function to form the impulse sequence.

(4) For example, the noise generator is configured to generate a plurality of noises having no correlation with each other, the addition noise generator is configured to generate a plurality of addition noises by adding the impulse noise to the respective noises, the impulse response generator is configured to generate a plurality of modified impulse response having no correlation with each other by multiplying the respective addition noises by the amplitude characteristic of the impulse response, and the impulse response convolver is configured to convolve the input audio signal with the respective modified impulse responses.

(5) For example, the reverberant sound adding apparatus further comprises a controller configured to set the first coefficient and the second coefficient to change a sound density of a reverberant sound of the convolved input audio signal.

(6) For example, the reverberant sound adding apparatus further comprises: a time expansion or compression processor configured to perform a time expansion or compression processing on the impulse response at a prescribed frequency band to change a reverberation time of a reverberant sound of the convolved input audio signal.

(7) There is also provided a reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

(8) For example, the generating of the addition noise comprises: multiplying the impulse noise by a first coefficient, multiplying the noise by a second coefficient, and generating the addition noise by adding an output of the multiplying of multiplying the impulse noise by the first coefficient to an output of the multiplying of multiplying the impulse noise by the second coefficient (9) For example, in the generating of the impulse response, impulses are generated at time intervals that are determined according to a prescribed probability density function to form the impulse sequence.

(10) For example, in the generating of the addition noise, a plurality of addition noises are generated by adding the impulse noise to respective noises having no correlation with each other, in the generating of the impulse response, a plurality of modified impulse response having no correlation with each other are generated by multiplying the respective addition noises by the amplitude characteristic of the impulse response, and in the convolving, the input audio signal is convolved with the respective modified impulse responses.

(11) For example, the reverberant sound adding method further comprises:

setting the first coefficient and the second coefficient to change a sound density of a reverberant sound of the convolved input audio signal.

(12). For example, the reverberant sound adding method further comprises: performing a time expansion or compression processing on the impulse response at a prescribed frequency band to change a reverberation time of a reverberant sound of the convolved input audio signal.

(13) There is provided a reverberant sound adding program for causing a computer to execute a reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

What is claimed is:

1. A reverberant sound adding apparatus, comprising:

a noise generator configured to generate a noise;

an impulse noise generator configured to generate an impulse noise comprising an impulse sequence with random time intervals;

an addition noise generator configured to generate an addition noise by adding the noise to the impulse noise;

an impulse response generator configured to generate a modified impulse response by multiplying the addition noise by an amplitude characteristic of an impulse response that indicates acoustic characteristics of a space; and an impulse response convolver configured to convolve an input audio signal with the modified impulse response.

2. The reverberant sound adding apparatus according to claim 1, wherein the addition noise generator comprises:

a first multiplier configured to multiply the impulse noise by a first coefficient;

a second multiplier configured to multiply the noise by a second coefficient; and an adder configured to generate the addition noise by adding an output of the first multiplier to an output of the second multiplier.

3. The reverberant sound adding apparatus according to claim 1, wherein the impulse response generator is configured to generate impulses at time intervals that are determined according to a prescribed probability density function to form the impulse sequence.

4. The reverberant sound adding apparatus according to claim 1, wherein the noise generator is configured to generate a plurality of noises having no correlation with each other;

wherein the addition noise generator is configured to generate a plurality of addition noises by adding the impulse noise to the respective noises;

wherein the impulse response generator is configured to generate a plurality of modified impulse response having no correlation with each other by multiplying the respective addition noises by the amplitude characteristic of the impulse response; and wherein the impulse response convolver is configured to convolve the input audio signal with the respective modified impulse responses.

5. The reverberant sound adding apparatus according to claim 2, further comprising:

a controller configured to set the first coefficient and the second coefficient to change a sound density of a reverberant sound of the convolved input audio signal.

6. The reverberant sound adding apparatus according to claim 1, further comprising:

a time expansion or compression processor configured to perform a time expansion or compression processing on the impulse response at a prescribed frequency band to change a reverberation time of a reverberant sound of the convolved input audio signal.

7. A reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

8. The reverberant sound adding method according to claim 7, wherein the generating of the addition noise, comprises:

multiplying the impulse noise by a first coefficient;

multiplying the noise by a second coefficient; and generating the addition noise by adding an output of the multiplication of the impulse noise by the first coefficient to an output of the multiplication of the impulse noise by the second coefficient.

9. The reverberant sound adding method according to claim 7, wherein in the generating of the impulse response, impulses are generated at time intervals that are determined according to a prescribed probability density function to form the impulse sequence.

10. The reverberant sound adding method according to claim 7, wherein in the generating of the addition noise, a plurality of addition noises are generated by adding the impulse noise to respective noises having no correlation with each other;

wherein in the generating of the impulse response, a plurality of modified impulse response having no correlation with each other are generated by multiplying the respective addition noises by the amplitude characteristic of the impulse response; and wherein in the convolving, the input audio signal is convolved with the respective modified impulse responses.

11. The reverberant sound adding method according to claim 8, further comprising:

setting the first coefficient and the second coefficient to change a sound density of a reverberant sound of the convolved input audio signal.

12. The reverberant sound adding method according to claim 7, further comprising:

performing a time expansion or compression processing on the impulse response at a prescribed frequency band to change a reverberation time of a reverberant sound of the convolved input audio signal.

13. A non-transitory computer readable storage medium storing a reverberant sound adding program for causing a computer to execute a reverberant sound adding method, comprising:

generating an addition noise by adding a noise to an impulse noise, the impulse noise comprising an impulse sequence with random time intervals;

generating a modified impulse response by multiplying the addition noise by an amplitude characteristic of an impulse response that indicates acoustic characteristics of a space; and convolving an input audio signal with the modified impulse response.

* * * * *